United States Patent
Volkov et al.

(10) Patent No.: US 9,618,857 B2
(45) Date of Patent: Apr. 11, 2017

(54) END EFFECTORS AND RETICLE HANDLING AT A HIGH THROUGHPUT

(71) Applicant: KLA-Tencor Corporation, Milpitas, CA (US)

(72) Inventors: Igor Volkov, Haifa (IL); Daniel Men, Haifa (IL); Oshri Amzaleg, Migdal HaEmek (IL)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 14/739,621

(22) Filed: Jun. 15, 2015

(65) Prior Publication Data

US 2016/0252826 A1   Sep. 1, 2016

Related U.S. Application Data

(60) Provisional application No. 62/126,448, filed on Feb. 28, 2015.

(51) Int. Cl.
*B25J 15/00* (2006.01)
*G03F 7/20* (2006.01)
(Continued)

(52) U.S. Cl.
CPC ...... *G03F 7/70741* (2013.01); *B25J 15/0014* (2013.01); *B25J 15/0253* (2013.01); *H01L 21/68728* (2013.01)

(58) Field of Classification Search
CPC ............... B25J 15/0014; B25J 15/0028; B25J 15/0253–15/0293; H01L 21/68707; H01L 21/68728; G03F 7/70741
(Continued)

(56) References Cited

U.S. PATENT DOCUMENTS 4,273,506 A * 6/1981 Thomson ............... B25J 9/046
                                                      294/106
4,968,082 A * 11/1990 Thinlot ................ B25J 15/026
                                                     294/119.1
(Continued)

FOREIGN PATENT DOCUMENTS

WO   2009/114193   9/2009

OTHER PUBLICATIONS

Bowling, Alan and Oussama Khatib. "Analysis of the Acceleration Characteristics of Manipulators," Robotics Laboratory, Department of Computer Science, Stanford University, Stanford, CA 94305 US, 1995.

(Continued)

*Primary Examiner* — Dean Kramer
(74) *Attorney, Agent, or Firm* — Simpson & Simpson, PLLC

(57) ABSTRACT

End effectors of reticle mechanical interface pods as well as reticle handling methods are provided, which handle the reticle by the end effector by applying a lateral force and/or a downward force on the reticle during the handling to fixate the reticle to at least two supports (e.g., at least four fingers) which are attached to at least two arms of the end effector and are configured to apply an upwards force on the reticle. Hence the reticle is fixated to the end effector and can be handled with higher accelerations and at a higher throughput than current methods. End effectors may have multiple fingers to fixate the reticle, and on more pushers may apply a downwards force to further fixate the reticle to the supports.

9 Claims, 8 Drawing Sheets

(51) Int. Cl.
*B25J 15/02* (2006.01)
*H01L 21/687* (2006.01)

(58) Field of Classification Search
USPC .................................................. 294/119.1
See application file for complete search history.

(56) References Cited

U.S. PATENT DOCUMENTS

| | | | |
|---|---|---|---|
| 5,127,695 A * | 7/1992 | Zoeten | B66C 1/24 294/119.1 |
| 6,256,555 B1 | 7/2001 | Bacchi et al. | |
| 6,275,748 B1 | 8/2001 | Bacchi et al. | |
| 6,409,453 B1 | 6/2002 | Brodine et al. | |
| 6,577,382 B2 | 6/2003 | Kida et al. | |
| 6,678,581 B2 | 1/2004 | Hung et al. | |
| 7,044,706 B2 * | 5/2006 | Jung | B25J 15/0052 294/119.1 |
| 7,140,655 B2 | 11/2006 | Kesil et al. | |
| 7,290,978 B2 * | 11/2007 | Tran | G03F 7/70741 414/763 |
| 7,318,697 B2 | 1/2008 | Wu et al. | |
| 7,562,923 B2 * | 7/2009 | Han | H05K 13/02 294/119.1 |
| 7,654,786 B2 * | 2/2010 | Kwon | B65G 49/061 414/226.02 |
| 7,695,239 B2 | 4/2010 | Wu | |
| 7,887,108 B1 * | 2/2011 | Cawley | B25J 15/022 294/106 |
| 8,317,241 B2 * | 11/2012 | Ehnes | B25J 9/142 294/192 |
| 8,376,428 B2 * | 2/2013 | Rebstock | B25J 15/0052 294/2 |
| 8,414,044 B2 * | 4/2013 | Weber | B25J 15/0266 294/119.1 |
| 2005/0094126 A1 * | 5/2005 | Yamamoto | G03F 7/70708 355/72 |
| 2009/0320417 A1 * | 12/2009 | Gilmore | B25J 15/0052 53/473 |
| 2013/0320636 A1 * | 12/2013 | Ogawa | H01L 21/68728 279/110 |

OTHER PUBLICATIONS http://ams.semi..org/ebusiness/standards/SEMIStandardDetail. aspx?ProductID=211&DownloadID=225, last accessed Feb. 23, 2015, "Semi E111-1104—Provisional Mechanical Specification for a 150 mm Reticle SMIF Pod (RSP150) Used to Transport and Store a 6 Inch Reticle".
http://ams.semi.org/ebusiness/standards/SEMIStandardDetail. aspx?ProductID=211&DownloadID=228, last accessed Feb. 23, 2015, Semi E112-1104—Provisional Mechanical Specification for a 150 mm Multiple Reticle SMIF Pod (MRSP150) Used to Transport and Store Multiple 6 Inch Reticles.
http://ams.semi.org/ebusiness/standards/SEMIStandardDetail. aspx?ProductID=211&DownloadID=1689, last accessed Feb. 23, 2015, Semi E100/1104 (Reapproved 0710)—Specification for a Reticle SMIF Pod (RSP) Used to Transport and Store 6 Inch or 230 mm Reticles.

* cited by examiner

END EFFECTORS AND RETICLE HANDLING AT A HIGH THROUGHPUT

CROSS-REFERENCE TO RELATED APPLICATIONS

This application claims the benefit of U.S. Provisional Patent Application No. 62/126,448 filed on Feb. 28, 2015, which is incorporated herein by reference in its entirety.

TECHNICAL FIELD

The present invention relates to the field of reticle handling in semiconductors industry, and more particularly, to an end effector.

BACKGROUND OF THE INVENTION

Reticles in the semiconductors industry are handled, i.e., moved from buffers to imagers, by end effectors of reticle mechanical interface pods, which carry the reticles at their bottoms to counter gravitation—passively, using friction and/or under suction.

SUMMARY OF THE INVENTION

The present invention comprises a method for handling a reticle, including the steps of applying at least a lateral force or a downward force on the reticle with an end effector to fixate the reticle to at least two supports which are attached to at least two arms of the end effector and are configured to apply an upwards force on the reticle.

The present invention also comprises an end effector, having at least two arms having at least two supports attached thereto, wherein the end effector is configured to handle a reticle by applying at least a lateral force or a downward force on a reticle during handling to fixate the reticle to the at least two supports, wherein the at least two supports are configured to apply an upwards force on the reticle.

The present invention also comprises an end effector for handling a reticle, the end effector comprising a gripper unit comprising at least two supports, with at least one support thereof on each of two gripper arms, and, a gripper arranged to control a horizontal movement of the gripper arms, wherein the end effector is movable vertically, the gripper is arranged to move the gripper fork arms inwardly with respect to the reticle, to position the at least two supports below a reticle bottom surface, and, the at least two supports are configured to fixate the reticle.

The present invention also comprises a reticle mechanical interface pod, having an end effector with at least two arms having at least two supports attached thereto, wherein the end effector is configured to handle a reticle by applying at least a lateral force or a downward force on a reticle during handling to fixate the reticle to the at least two supports, wherein the at least two supports are configured to apply an upwards force on the reticle, wherein the reticle mechanical interface pod is configured to move the reticle by controlling the end effector.

The following is a simplified summary providing an initial understanding of the invention. The summary does not necessarily identify key elements nor limit the scope of the invention, but merely serves as an introduction to the following description.

One aspect of the present invention provides a method comprising handling a reticle by an end effector by applying at least a lateral force or a downward force on the reticle during the handling to fixate the reticle to at least two supports which are attached to at least two arms of the end effector and are configured to apply an upwards force on the reticle.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings.

DETAILED DESCRIPTION OF THE INVENTION

Figure 1:
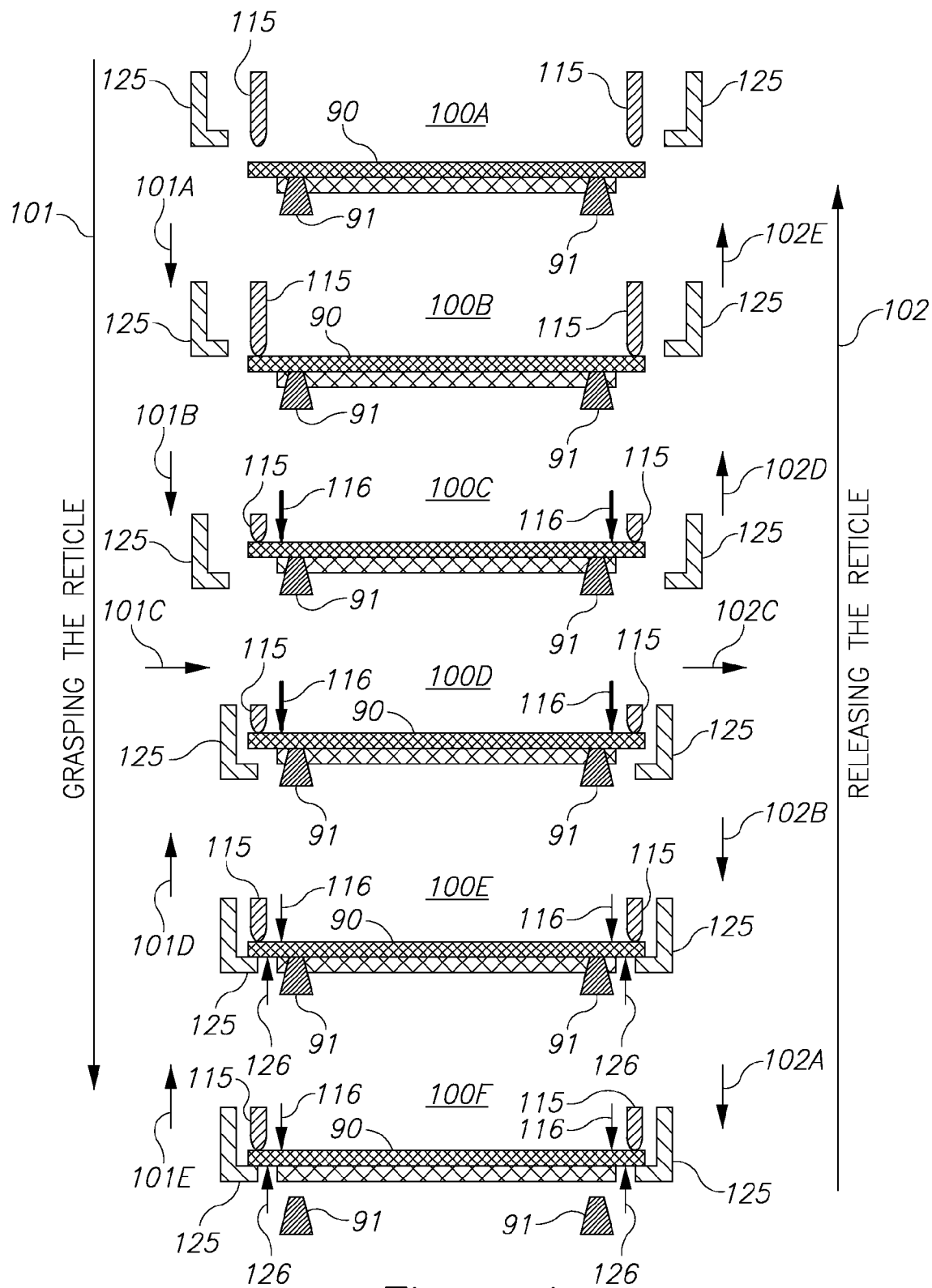
FIG. 1 is a high level schematic illustration of handling a reticle by an end effector, according to some embodiments of the invention.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in he following description or illustrated in the drawings. The invention is applicable to other embodiments or of being practiced or carried out in various ways. Also, it is to be understood that the phraseology and terminology employed herein is for the purpose of description and should not be regarded as limiting.

Unless defined otherwise, all technical and scientific terms used herein have the same meaning as commonly understood to one of ordinary skill in the art to which this invention belongs. Although any methods, devices or materials similar or equivalent to those described herein can be used in the practice or testing of the invention, the preferred methods, devices, and materials are now described.

In the below description, an embodiment is an example or implementation of the invention. The various appearances of "one embodiment", "an embodiment", "certain embodiments" or "some embodiments" do not necessarily all refer to the same embodiments.

End effectors of reticle mechanical interface pods as well as reticle handling methods are provided, which handle the reticle by the end effector by applying a lateral force and/or a downward force on the reticle during the handling to fixate the reticle to at least two supports (e.g., at least four fingers) which are attached to at least two arms of the end effector and are configured to apply an upwards force on the reticle. Hence the reticle is fixated to the end effector and can be handled with higher accelerations and at a higher throughput than current methods. End effectors may have multiple fingers to fixate the reticle, and on more pushers may apply a downwards force to further fixate the reticle to the supports.

Figure 2:
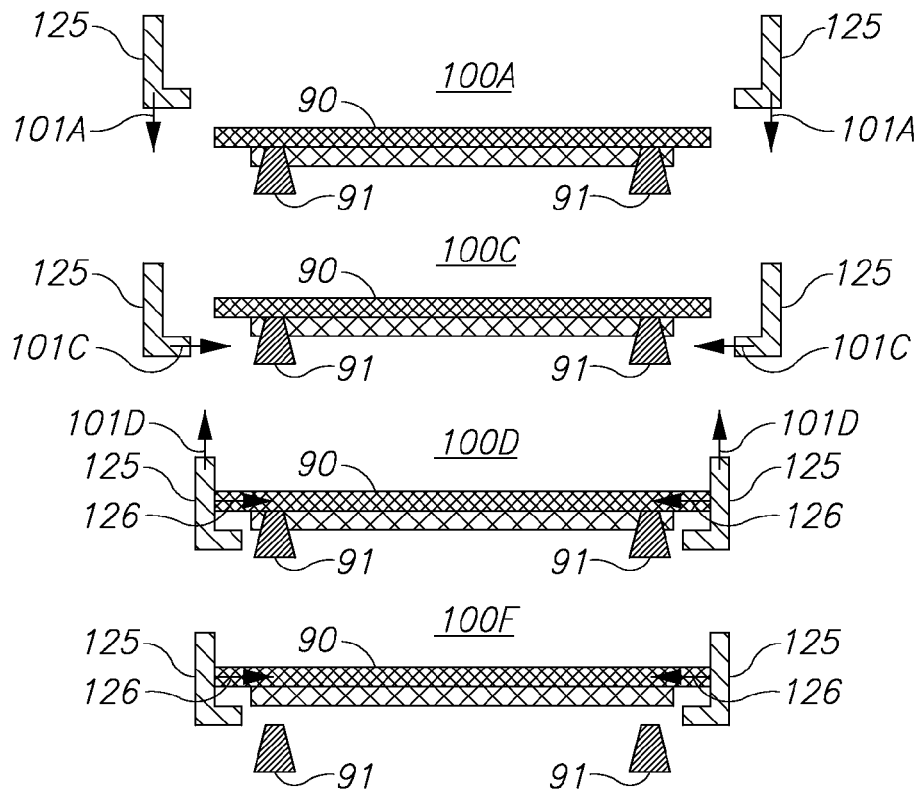
FIG. 2 is a high level schematic illustration of handling a reticle by an end effector, according to some embodiments of the invention.

Referring now to the drawings, FIGS. 1 and 2 are high level schematic illustrations of handling a reticle 90 by an end effector 100, according to some embodiments of the invention. Certain embodiments comprise a reticle mechanical interface pod (not illustrated) configured to move reticle 90 by controlling end effector 100 of any of the embodiments.

End effector 100 may be configured to handle any type of reticle, in a non-limiting example, six inch reticles. End effector 100 may be configured to be operated by any reticle mechanical interface pod, e.g., pods specified by SEMI E100-1104 (RSP200) and/or SEMI E111-1213 (RSP150) and handle transferal of reticles 90 between reticle buffers, pre-aligners and imagers.

End effector 100 may be configured to handle reticle in the following manner, illustrated as end effector states 100A-100F in FIG. 1. End effector 100 may comprise supports 125 (e.g., fingers 125) and pusher(s) 115 which approach reticle 90 positioned on its supports 91 (e.g., of a reticle carrier) prior to grasping the reticle (indicated by arrow 101). End effector may first be lowered 101A by the reticle mechanical interface pod in a vertical downwards movement until pushers 115 contact reticle 90 as illustrated in end effector state 100B. Upon further downwards movement 101B, pushers 115 apply a downwards force 116 onto reticle 90 which stabilizes is on supports 91, as illustrated in end effector state 100C, while supports 125 are lowered below the edges of reticle 90, still under the vertical downwards movement controlled by the reticle mechanical interface pod. Upon being positioned at a specified distance below reticle 90, as illustrated in end effector state 100D, supports 125 may be moved inwardly 101C by end effector 100 (e.g., by one or more spring and/or one or more piston and/or one or more vacuum application or any other comparable means) to be positioned below reticle 90. Then, upon vertical upwards movements 101D, 101E which may be controlled by the reticle mechanical interface pod, supports 125 contact reticle 90 from its lower side, as illustrated in end effector state 100E, and gradually apply an upwards lifting force 126 to lift reticle 90 from supports 91, as illustrated in end effector state 100F, while pushers 115 continue to apply vertical force 116 which may be reduced with respect to fixating force 116 applied in end effector state 100D but still fixates reticle 90 after being lifted by supports 125. After being lifted by supports 125 and fixated by pushers 115, reticle may be handled, e.g., transferred to a different location, to and/or from a tool etc.

In a complementary action of releasing the reticle (indicated by arrow 102), reticle 90 held by supports 125 and fixated by pushers 115, as illustrated in end effector state 100F, may be lowered 102A and then set on supports 91, as illustrated in end effector state 100E, e.g., controllable by a vertical downwards movement controlled by the reticle mechanical interface pod. Upon further downwards movement 102B, supports 125 may be lowered below reticle 90 while pushers increase fixating force 116, as illustrated in end effector state 100D, and then supports 125 may be removed from below reticle 90 by outward lateral movement 102C applied by end effector 100 (e.g., by one or more spring and/or one or more piston and/or one or more vacuum application or any other comparable means) to reach illustrated end effector state 100C. Then supports 125 and pushers 115 may be raised 102D until fixating three is released, as illustrated in end effector state 100B, and further 102E to detach reticle 90 completely, as illustrated in end effector state 100A. Hence, FIG. 1 schematically illustrates a complete reticle handling cycle, It is noted that while at least two pushers 115 are illustrated in FIG. 1, one pusher 115, one pair of pushers 115 or any number of pushers 115 or pairs of pushers 115 may be used to fixate reticle 90. It is further noted that supports 125 may be continuous on each side of reticle 90, or may be divided into discrete elements, e.g., four fingers 125, pairs of fingers 125 or any other mechanically feasible and efficient configuration.

FIG. 2 schematically illustrates the reticle handling by end effector 100 applying a lateral fixating force 126 on reticle 90 rather than downward force 116 applied by pushers 115, or in addition thereto. Similarly to FIG. 1, FIG. 2 illustrates downwards approach 101A of fingers 125 (as supports 125) to reticle 90 to supports 101, controllable by a vertical downwards movement controlled by the reticle mechanical interface pod, inwards movement 101C of fingers 125, applied by end effector 100 (e.g., by one or more spring and/or one or more piston and/or one or more vacuum application or any other comparable means), fixation of reticle by lateral force 126 and upon upwards movement 101D of fingers 125, simultaneous application of both lateral fixating force 126 and upwards force by fingers 125, in the illustrated case without employing pushers 115.

Figure 3A:
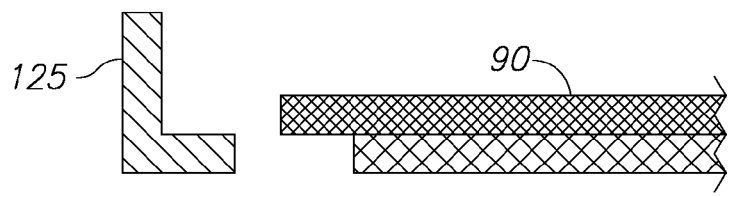
FIG. 3A is a high level schematic illustration of engaging the reticle by a support, according to some embodiments of the invention.
Figure 3B:
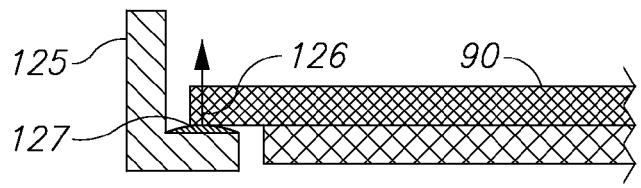
FIG. 3B is a high level schematic illustration of engaging the reticle by a support, according to some embodiments of the invention.
Figure 3C:
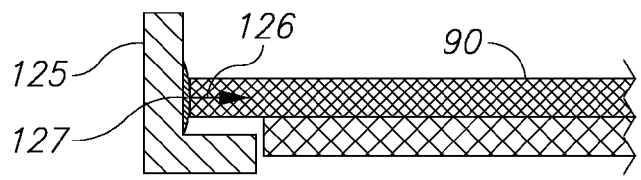
FIG. 3C is a high level schematic illustration of engaging the reticle by a support, according to some embodiments of the invention.

FIGS. 3A-3C are high level schematic illustrations of engaging reticle 90 by support 125 (e.g., finger 125), according to some embodiments of the invention. FIG. 3A schematically illustrates approaching support 125. FIG. 3B schematically illustrates application of upward force 126, e.g., via a padding 127 attached to support 125. FIG. 3C schematically illustrates application of lateral force 126, and possibly also upward force 126, e.g., via padding 127 attached to support 125. It is noted that in embodiments illustrated in FIGS. 2 and 3C, the sides of supports 125 may apply both fixating lateral force and lifting upward force on reticle 90.

FIGS. 4-6 and 7A, 7B are high level schematic illustrations of end effector 100, according to some embodiments of the invention. Illustrated end effectors 100 implement reticle handling principles illustrated in FIGS. 1 and 2, as non-limiting embodiments. End effector 100 may comprise at least two arms 120, 120A, 120B (in different FIGS. 4-6 and 7A, 7B) having at least two supports 125 (e.g., at least four fingers 125) attached thereto. End effector 100 is configured to handle reticle 90 by applying lateral force 126 and/or downward force 116 on reticle 90 during the handling to fixate reticle 90 to at least two supports 125 (e.g., at least four fingers 125). At least two supports 125 are configured to apply upwards force 126 on the reticle. Further illustrated are horizontal inwards/outwards movement 121 of fingers 125 applied by end effector 100, e.g., by one or more spring and/or one or more piston and/or one or more vacuum application or any other comparable means, and vertical upward/downward movement 105 controllably applied by the reticle mechanical interface pod (not illustrated).

Figure 4:
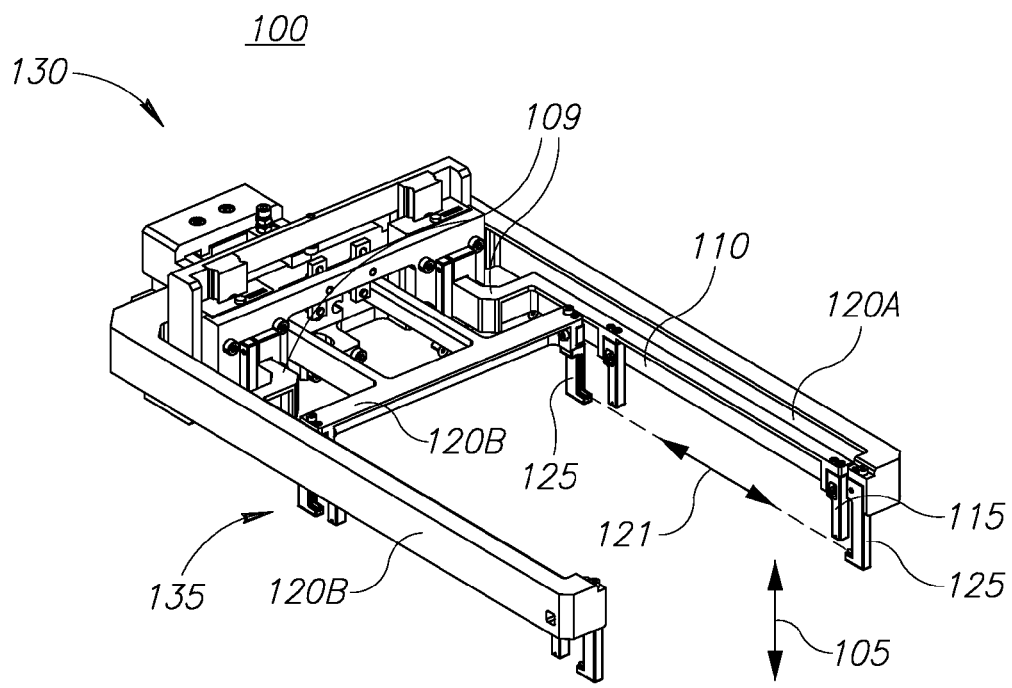
FIG. 4 is a high level schematic illustration of an end effector, according to some embodiments of the invention.
Figure 5:
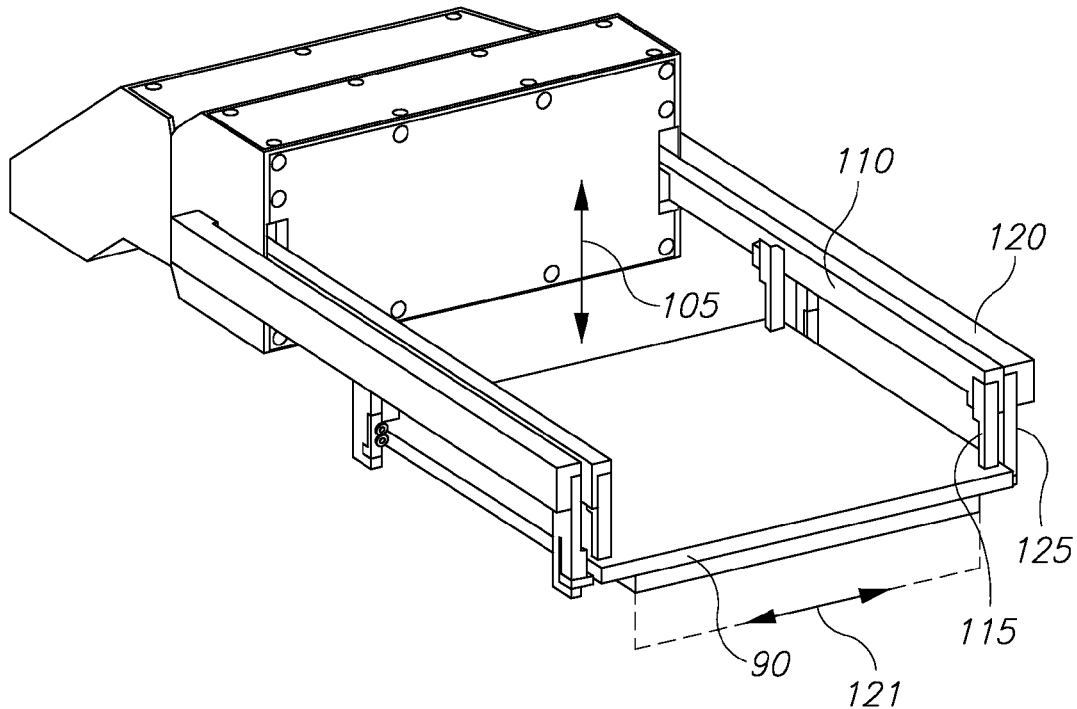
FIG. 5 is a high level schematic illustration of an end effector, according to some embodiments of the invention.

FIGS. 4 and 5 schematically illustrate embodiments in which end effector 100 comprises at least one pusher 115 (four pushers 115 are illustrated in a non-limiting manner) configured to apply downwards force 116 on reticle 90. While both FIGS. 4 and 5 illustrate four pushers 115, each located at a corner of reticle 90, certain embodiments comprise two pushers 115, one on each side of reticle 90, i.e., between respective pairs of illustrated pushers 115, e.g., in the middle of the respective reticle side. End effector 100 may comprise a gripper unit 130 with at least one finger 125 on each of two gripper arms 120A (optionally also basis 120B) and a gripper 135 arranged to control horizontal movement 121 of gripper arms 120A (optionally also basis 120B).

While end effector 100 is movable vertically by the reticle mechanical interface pod, gripper 135 may be arranged to move gripper fork arms 120 inwardly with respect to reticle 90 (either longitudinally or laterally), to position fingers 125 below the bottom surface of reticle 90 and consecutively fixate reticle 90 by fingers 125.

FIG. 4 schematically illustrates a longitudinal application of fingers 125 with respect to end effector 100, in which horizontal movement 121 is longitudinal with fingers 125 on arms 120A moving relatively to fingers 125 on basis 120B (either arms 120A and/or basis 120B may perform the actual movement), while FIG. 5 schematically illustrates a transversal application of fingers 125 with respect to end effector 100, in which horizontal movement 121 is transversal with fingers 125 on one of arms 120A moving relatively to fingers 125 on another one of arms 120A (either or both arms 120A may perform the actual movement). In FIGS. 4 and 5, the fixating force is applied by pushers 115 attached to respective pusher arms 110 (as illustrated in FIGS. 1 and 3B) as downward force 116.

End effector 100 may further comprise a pusher fork 109 comprising at least one pusher 115, at least one pusher 115 on each of at least one pusher fork arm 110 (two pusher fork arms 110 are illustrated in a non-limiting manner). Pushers 110 may be configured to contact and press against the top surface of reticle 90 upon downwards movement 105 of end effector 100. Upon handling reticle 90, fingers 125 may be configured to fixate reticle 90 against pushers 115 upon consequent upwards movement of end effector 100. Pusher fork 109 may be moved on vertical linear slides, e.g., be pulled downwards by vertical extension springs, and be controlled by using already existing robot vertical motion.

Figure 6:
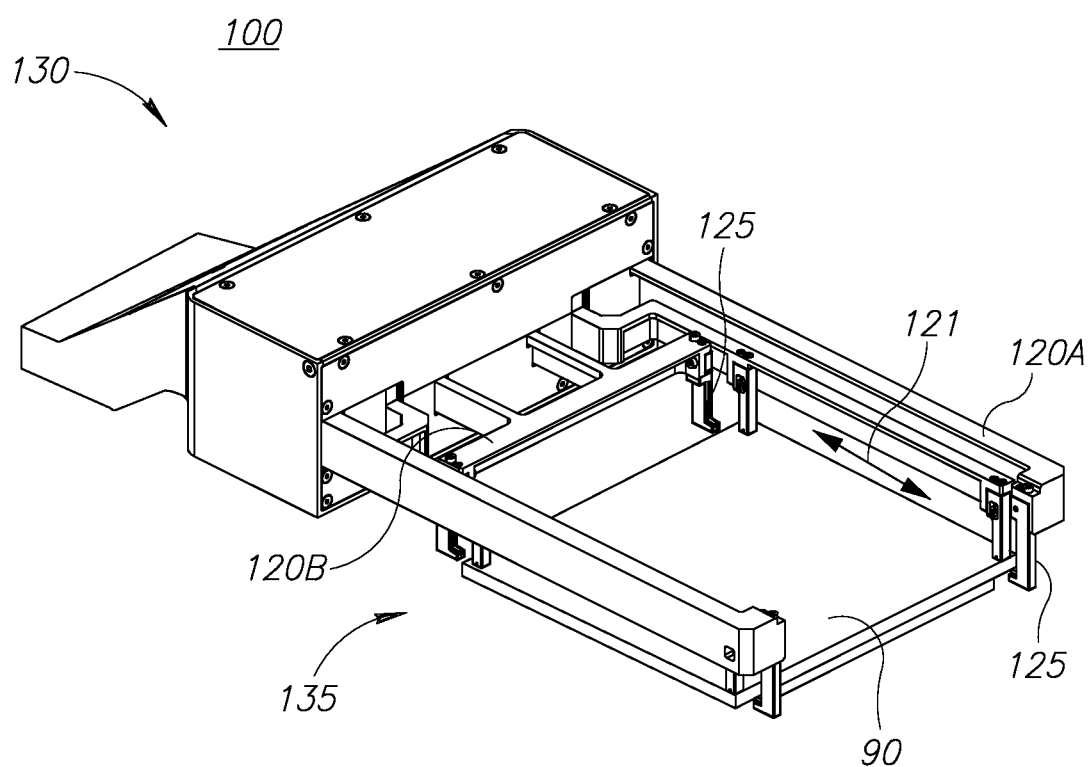
FIG. 6 is a high level schematic illustration of an end effector, according to some embodiments of the invention.

FIG. 6 schematically illustrates a longitudinal application of fingers 125 with respect to end effector 100, in which horizontal movement 121 is longitudinal with fingers 125 on arms 120A moving relatively to fingers 125 on basis 120B (either arms 120A and/or basis 120B may perform the actual movement). In FIG. 6, the fixating force is applied by fingers 125 (as illustrated in FIGS. 2 and 3C) as lateral force 126. In certain embodiments, an air gripper may have two parallel rails and slides, to which two separate forks 120A, 12013 may be fastened. Air gripper may be configured to open and close forks 120A, 120B on reticle 90, to fixate reticle 90 by fingers 125 at the bottom front and back of reticle with respect to end effector 100.

Figure 7A:
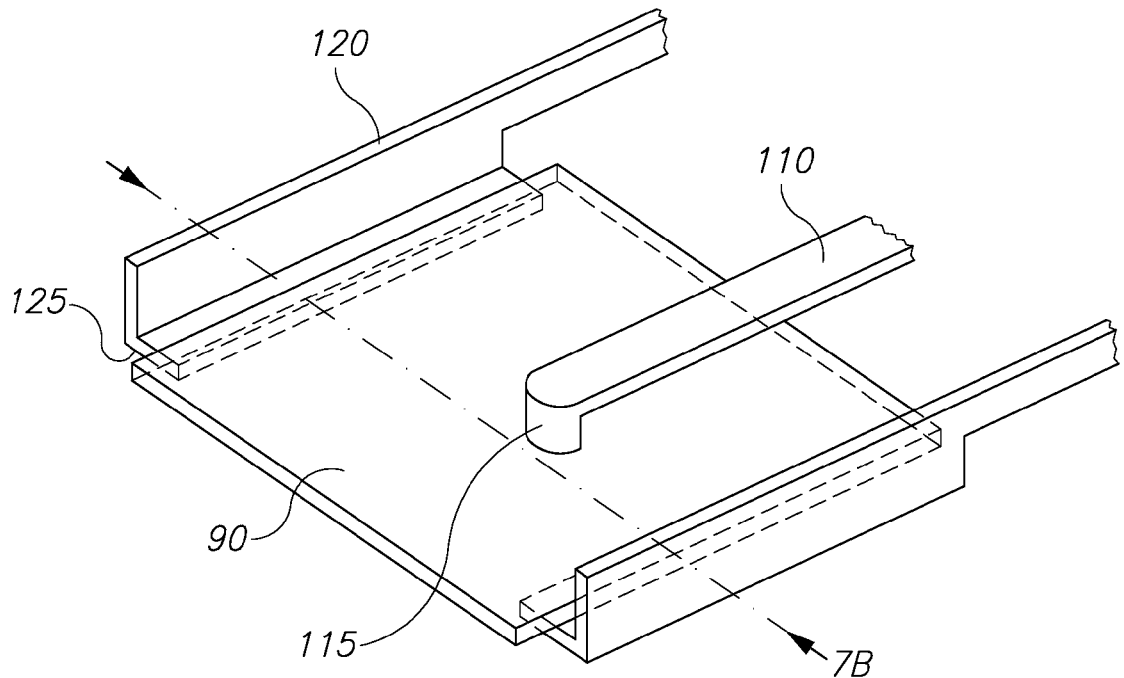
FIG. 7A is a high level schematic illustration of an end effector, according to some embodiments of the invention.
Figure 7B:
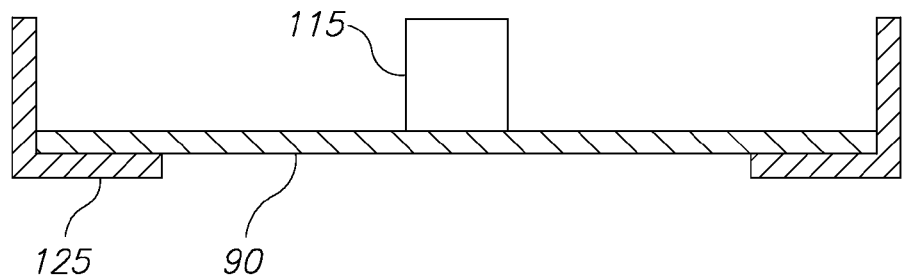
FIG. 7B is a high level schematic illustration of an end effector, according to some embodiments of the invention.

FIGS. 7A and 7B schematically illustrate end effector 100 having two supports 125, each attached to respective aim 120, that fixate reticle to end effector 100, e.g., by applying a lateral and/or an upwards force (FIG. 7B is a cross section indicating the side and bottom contact areas of reticle 90 to supports 125). One (or more) pusher 115 connected to pusher arm 110 may apply a downwards force on reticle 90 to further fixate it to supports 125.

Figure 8:
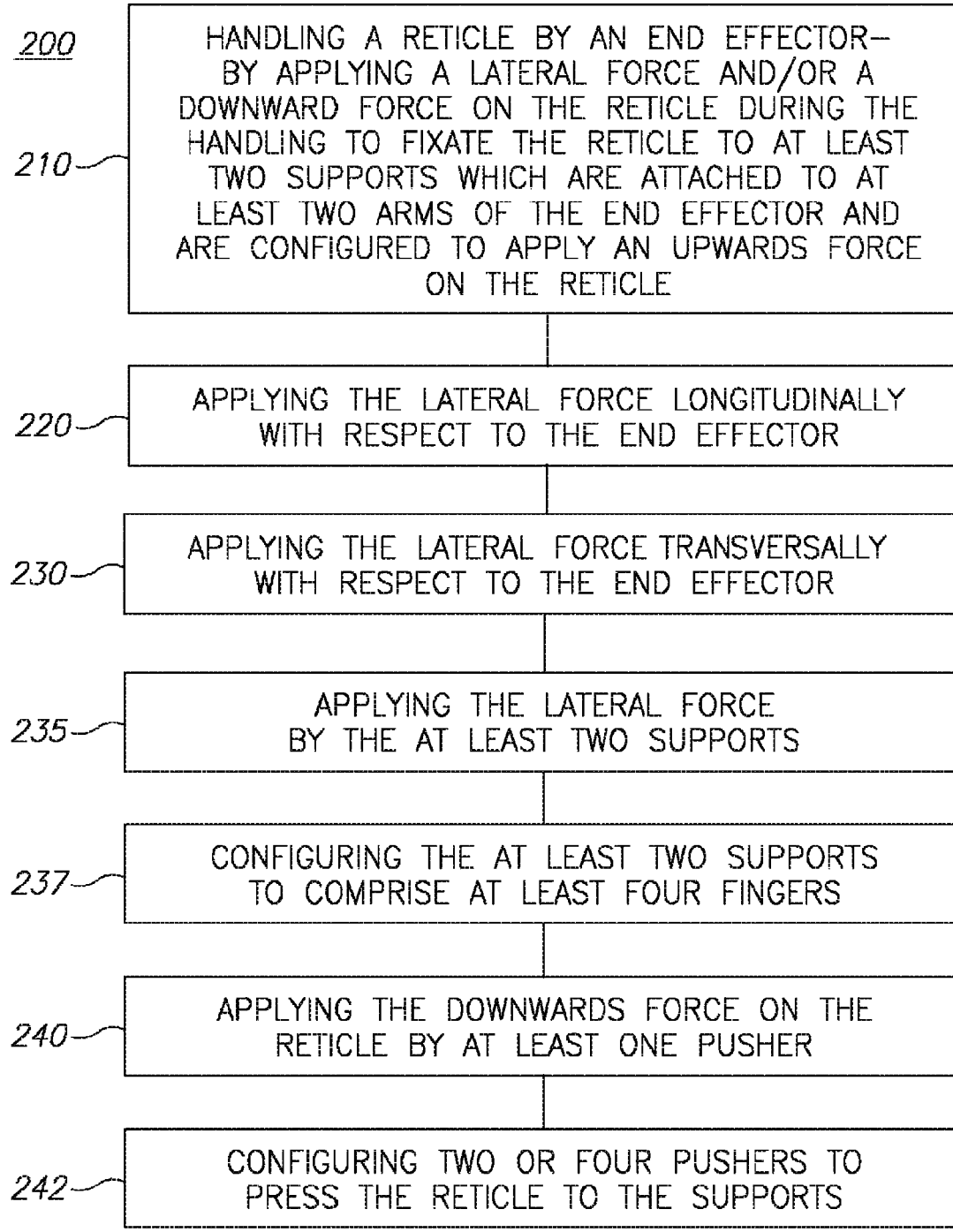
FIG. 8 is a high level flowchart illustrating a method of handling a reticle, according to some embodiments of the invention.

FIG. 8 is a high level flowchart illustrating a method 200 of handling a reticle, according to some embodiments of the invention. Method 200 may comprise handling a reticle by an end effector by applying at least a lateral force or a downward force on the reticle during the handling to fixate the reticle to at least two supports which are attached to at least two arms of the end effector and are configured to apply an upwards force on the reticle (stage 210).

Method 200 may comprise applying the lateral force longitudinally with respect to the end effector (stage 220) and/or applying the lateral force transversally with respect to the end effector (stage 230). Method 200 may comprise applying the lateral force by the at least two supports (stage 235). In certain embodiments, Method 200 may comprise applying the downwards force on the reticle by at least one pusher (stage 240).

For example, method 100 may comprise configuring the at least two supports to comprise at least four fingers (stage 237) and/or configuring two or four pushers to press the reticle to the supports (stage 242).

Experimental results have verified the mechanical viability of illustrated embodiments of end effector 100 with respect to the mechanical strength of fingers 125, pushers 115 and arms 110, 120, as well as with respect to possible handling accelerations of reticle 90.

Figure 9:
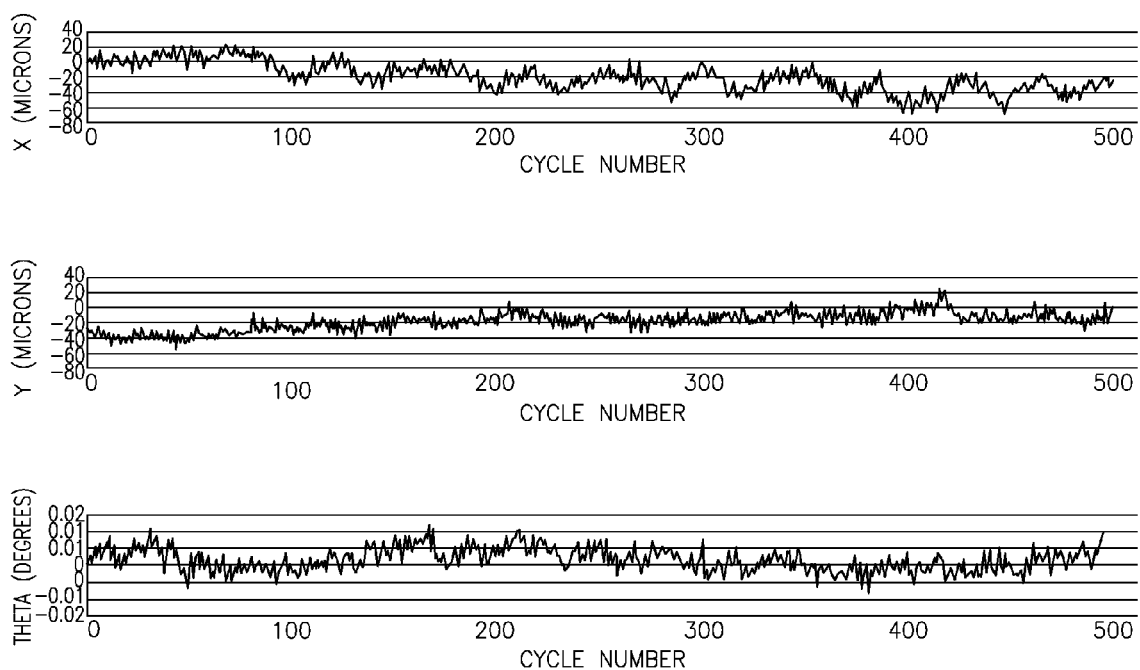
FIG. 9 is a graphical representation of exemplary experimental repeatability results regarding the end effector, according to some embodiments of the invention; and, FIG. 10 is a graphical representation of exemplary experimental reliability results regarding the end effector, according to some embodiments of the invention.
Figure 10:
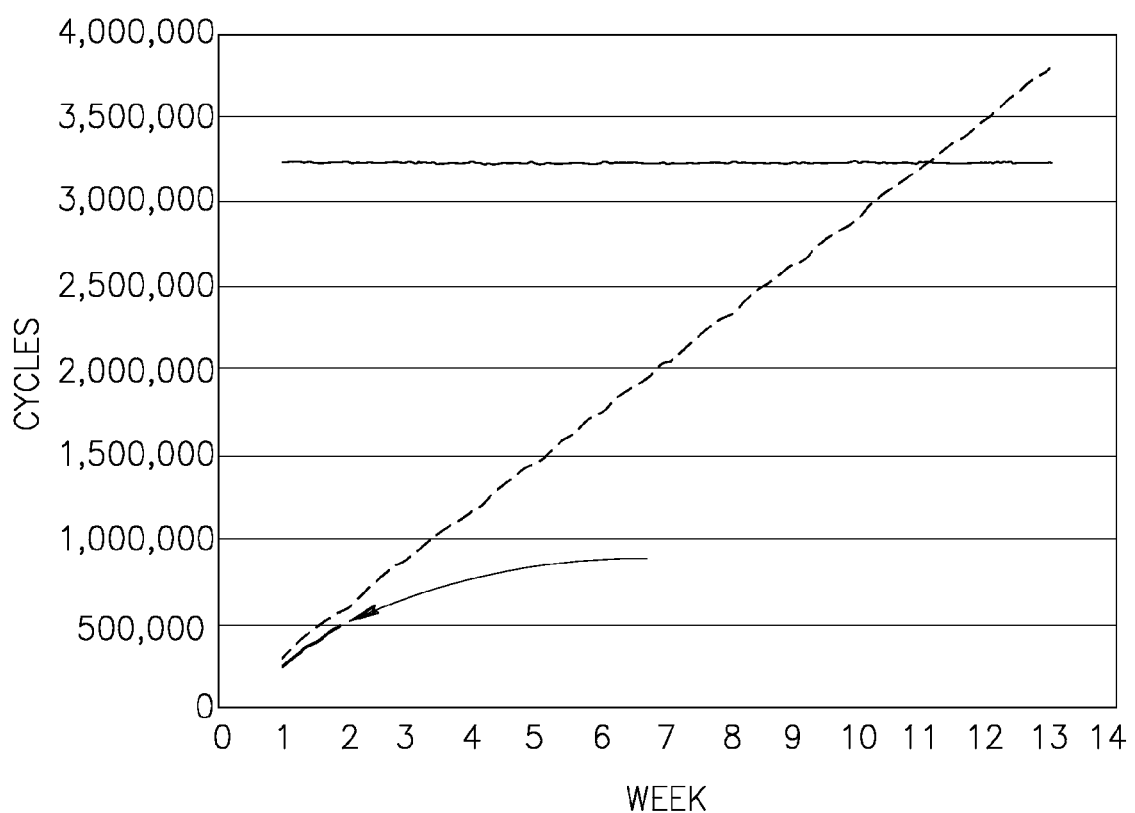

FIGS. 9 and 10 present exemplary experimental repeatability and reliability results regarding end effector 100, according to some embodiments of the invention. FIG. 9 illustrates repetition accuracy of end effector 100 in a test involving moving a reticle with specific targets back and forth between two positions. The three graphs depict the displacements in x, y (linear displacements) and in θ (rotation displacement) with respect to the preceding reading of the target's positions by respective measurement systems. The graphs illustrate the repeatability of the reticle placing exhibited by end effector 100 over 500 cycles. FIG. 10 illustrates initial reliability results of 480,000 gripper cycles, carried out without any failures. The initial results are indicated by the arrow and are to be completed and compared to the theoretical reliability denoted by the diagonal line until reaching a specifications requirement denoted by the horizontal line (at ca. 3,200,000 cycles).

Advantageously, holding reticle 90 on all sides provides a firm grip of reticle 90 and the fixation of reticle 90 to end effector 100 provides higher throughput due to the possibility to handle reticle 90 at higher accelerations and with a higher degree of control. This is in contrast to common methods that hold the reticles at their bottoms only to counter gravitation. Certain fixation embodiments hence hold the reticles with significantly larger forces that forces resulting from the reticle's weight alone. Specifically, enduring high acceleration, the reticle fixation prevents the reticle to slip as it would with common end effectors. Furthermore, operation of end effector 100 relies on existing movement axes (up and down by the reticle mechanical interface pod, lateral movements by existing gripping mechanisms) and do not necessarily requires additional activation mechanisms in end effector 100.

Although various features of the invention may be described in the context of a single embodiment, the features may also be provided separately or in any suitable combination. Conversely, although the invention may be described herein in the context of separate embodiments for clarity, the invention may also be implemented in a single embodiment.

Certain embodiments of the invention may include features from different embodiments disclosed above, and certain embodiments may incorporate elements from other embodiments disclosed above. The disclosure of elements of the invention in the context of a specific embodiment is not to be taken as limiting their used in the specific embodiment alone.

Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described.

While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

What is claimed is:

1. A method for handling a reticle, comprising the steps of:
    positioning first and second fingers for an end effector beyond a reticle in an upward vertical direction;
    positioning first and second pushers for the end effector above the reticle in the upward vertical direction and between the first and second fingers;
    moving the first and second fingers in a downward vertical direction, opposite the upward vertical direction;
    positioning the first and second fingers beyond the reticle in the downward vertical direction;
    moving the first and second pushers in the downward vertical direction;
    contacting the reticle with the first and second pushers;
    moving the first and second fingers in the upward vertical direction;
    applying, with the first and second fingers, force on the reticle in the upward vertical direction; and,
    applying a lateral force, with the first and second fingers, longitudinally or transversally with respect to the end effector.

2. The method of claim 1, further comprising:
    positioning third and fourth fingers for the end effector beyond the reticle in the upward vertical direction;
    positioning the first and second pushers for the end effector above the reticle in the upward vertical direction and between the third and fourth fingers;
    moving the third and fourth fingers in the downward vertical direction, opposite the upward vertical direction;
    positioning the third and fourth fingers beyond the reticle in the downward vertical direction;
    moving the third and fourth fingers in the upward vertical direction; and,
    applying, with the third and fourth fingers, force on the reticle in the upward vertical direction.

3. The method of claim 1, further comprising applying a downwards force on the reticle by the first and second pushers.

4. An end effector, comprising:
    first and second fingers; and,
    a pusher fork comprising first and second pushers,
    wherein the first and second pushers are positionable above a reticle in the upward vertical direction and between the first and second fingers; the first and second fingers are movable in a downward vertical direction, opposite the upward vertical direction; the first and second pushers are movable in the downward vertical direction to contact and apply a downward force on the reticle; and, the first and second fingers are movable in the upward vertical direction and a lateral direction, to apply an upward vertical force on the reticle in the upward vertical direction and apply a lateral force on the reticle longitudinally or transversally with respect to the end effector.

5. The end effector of claim 4, further comprising:
    third and fourth fingers, wherein:
        the third and fourth fingers are movable in a downward vertical direction, opposite the upward vertical direction;
        the first and second pushers are positionable between the third and fourth fingers; and,
        the third and fourth fingers are movable in the upward vertical direction to apply force on the reticle in the upward vertical direction.

6. An end effector for handling a reticle, the end effector comprising:
    first and second fingers; and,
    a pusher fork comprising first and second pushers,
    wherein the first and second fingers are positionable beyond a reticle in an upward vertical direction; the first and second pushers are positionable above the reticle in the upward vertical direction and between the first and second fingers; the first and second fingers are movable in a downward vertical direction beyond the reticle in the downward vertical direction, while remaining laterally beyond the reticle; following the movement in the downward vertical direction, the first and second fingers are moveable in a lateral direction, longitudinally or transversally with respect to the reticle; the first and second pushers are movable in the downward vertical direction to contact and apply a downward force on the reticle; and, the respective fingers are movable in the upward vertical direction and the lateral direction, to apply an upward vertical force on the reticle in the upward vertical direction and apply a lateral force on the reticle, longitudinally or transversally with respect to the reticle.

7. The end effector of claim 6, wherein at least one pusher is located on each of at least one pusher fork arm, the at least one pusher configured to contact and press against a reticle top surface upon a downwards movement of the end effector, wherein the first and second fingers are configured to fixate the reticle against the at least one pusher upon consequent upwards movement of the end effector.

8. The end effector of claim 7, further comprising:
third and fourth fingers, wherein:
the third and fourth fingers are positionable beyond the reticle in an upward vertical direction;
the first and second pushers are positionable between the third and fourth fingers;
the third and fourth fingers are movable in a downward vertical direction beyond the reticle in the downward vertical direction, while remaining laterally beyond the reticle;
following the movement in the downward vertical direction, the third and fourth fingers are moveable only laterally toward the reticle; and,
the third and fourth fingers are movable in the upward vertical direction to apply force on the reticle in the upward vertical direction.

9. A method for handling a reticle, comprising the steps of:
positioning first and second fingers for an end effector beyond a reticle in an upward vertical direction;
positioning first and second pushers for the end effector above the reticle in the upward vertical direction and between the first and second fingers;
moving the first and second fingers in a downward vertical direction, opposite the upward vertical direction, while the first and second fingers remain laterally beyond the reticle;
positioning the first and second fingers beyond the reticle in the downward vertical direction;
moving the first and second pushers in the downward vertical direction;
contacting the reticle with the first and second pushers;
moving the first and second fingers in a lateral direction, longitudinally or transversally with respect to the end effector;
applying, with the first and second fingers, force on the reticle in the lateral direction, longitudinally or transversally with respect to the reticle;
moving the first and second fingers in the upward vertical direction; and,
applying, with the first and second fingers, force on the reticle in the upward vertical direction.

* * * * *